United States Patent
Stevens, Jr.

[11] Patent Number: 6,125,496
[45] Date of Patent: *Oct. 3, 2000

[54] PAD AND ROLLER ASSEMBLY FOR CLEANING SEMICONDUCTOR WAFERS

[75] Inventor: Leonard Corbett Stevens, Jr., Poughquag, N.Y.

[73] Assignee: International Business Machines Corporation, Armonk, N.Y.

[ * ] Notice: This patent is subject to a terminal disclaimer.

[21] Appl. No.: 09/109,225

[22] Filed: Jun. 30, 1998

Related U.S. Application Data

[63] Continuation of application No. 08/686,048, Jul. 24, 1996, Pat. No. 5,813,082.

[51] Int. Cl.[7] .................................................... A47L 25/00
[52] U.S. Cl. ....................... 15/230.13; 15/102; 15/230.19
[58] Field of Search .................................. 15/102, 103.5, 15/230, 230.13, 230.19; 198/498; 451/496, 531; 492/13, 45, 48, 55

[56] References Cited

U.S. PATENT DOCUMENTS

| | | |
|---|---|---|
| 801,003 | 10/1905 | Gordon . |
| 869,572 | 10/1907 | Hunt . |
| 2,630,657 | 3/1953 | Harley . |
| 3,610,693 | 10/1971 | Solarek . |
| 3,886,622 | 6/1975 | Horst . |
| 4,692,975 | 9/1987 | Garcia . |
| 4,947,029 | 8/1990 | Kurihara et al. . |
| 5,230,124 | 7/1993 | Booth . |
| 5,813,082 | 9/1998 | Stevens ........................ 15/230.13 |

*Primary Examiner*—Terrence R. Till
*Attorney, Agent, or Firm*—Aziz M. Ahsan

[57] ABSTRACT

A cleaning pad and roller assembly for cleaning semiconductor wafers. The pad may be a felt sheet with a pair of tabs located at opposite ends. The roller may be polyvinylchloride and may have a drive gear at one end and a clamp at each end. Each clamp is a clamping lever mounted on a shelf and may be locked in place by a clamping screw. Each clamping lever may have a pivot at one end and a serrated surface at an opposite end. The clamping screw may pass through the clamping lever into the shelf.

21 Claims, 3 Drawing Sheets

PAD AND ROLLER ASSEMBLY FOR CLEANING SEMICONDUCTOR WAFERS

CROSS-REFERENCE TO A RELATED PATENT APPLICATION

This patent application is a Continuation of U.S. patent application Ser. No. 08/686,048, filed on Jul. 24, 1996, now U.S. Pat. No. 5,813,082, issued on Sep. 29, 1998, and the disclosure of which is incorporated herein by reference.

FIELD OF THE INVENTION

The present invention relates generally to Semiconductor Manufacturing Apparatus and more particularly to a pad and roller assembly for cleaning semiconductor wafers.

BACKGROUND OF THE INVENTION

Semiconductor Chip Manufacturing is a complicated multistep process. At each step, a semiconductor wafer may be subjected to some type of chemical process that changes the wafer's structure. Residue or debris may be left on the wafer from a particular chemical process. That residue must be cleaned from the wafer without damaging the partially completed chip structures. One way these wafers are cleaned is washing, i.e., applying a fluid onto the wafer and then, wiping the fluid off with a cleaning pad.

Typical prior art rollers used for cleaning semiconductor wafers included some type of metallic material. However, metals corrode; Corrosion diminishes the pad's cleaning effectiveness. Also, the metal from the roller dissolves, slightly, introducing metallic ions into the cleaning process. These metallic ions may contaminate the wafer rather than cleaning it.

Also, other types of foreign material from the pad may contaminate the wafer or circuit, defeating the purpose of cleaning. One source of contamination was the means of attaching the pad to the cleaning apparatus. Some prior art cleaning pads are permanently attached to a roll for easy assembly/disassembly. Typically, they are attached to the roll with glue or metal staples. However, glue may melt, mixing with and contaminating the cleaning solutions. Staples may corrode, providing another source of corrosion. Additionally, staples may project above the pad surface, to scratch the wafer surface being cleaned. Thus, there is a need for an improved cleaning pad and roll assembly.

PURPOSES OF THE INVENTION

It is a purpose of the present invention to improve semiconductor wafer cleaning pad effectiveness.

It is another purpose of the present invention to improve semiconductor wafer cleaning pad effectiveness without impairing the function of any circuit being cleaned by the pad.

It is yet another purpose of the present invention to simplify semiconductor wafer cleaning pad replacement.

SUMMARY OF THE INVENTION

The preferred embodiment of the present invention is a cleaning pad and roller assembly for cleaning semiconductor wafers. The roller may be polyvinylchloride. The pad may be a commercially available felt material with a pair of tabs located at opposite ends. The roller may have a drive gear at one end and a clamp at each end. Each clamp is a clamping lever mounted on a shelf and may be locked in place by a clamping screw. Each clamping lever may have a pivot at one end and a serrated surface at an opposite end. The clamping screw may pass through the clamping lever into the shelf.

DESCRIPTION OF THE PREFERRED EMBODIMENTS

The present invention is a cleaning apparatus, cleaning roller and cleaning pad for cleaning semiconductor wafers in semiconductor chip manufacture.

Figure 1:
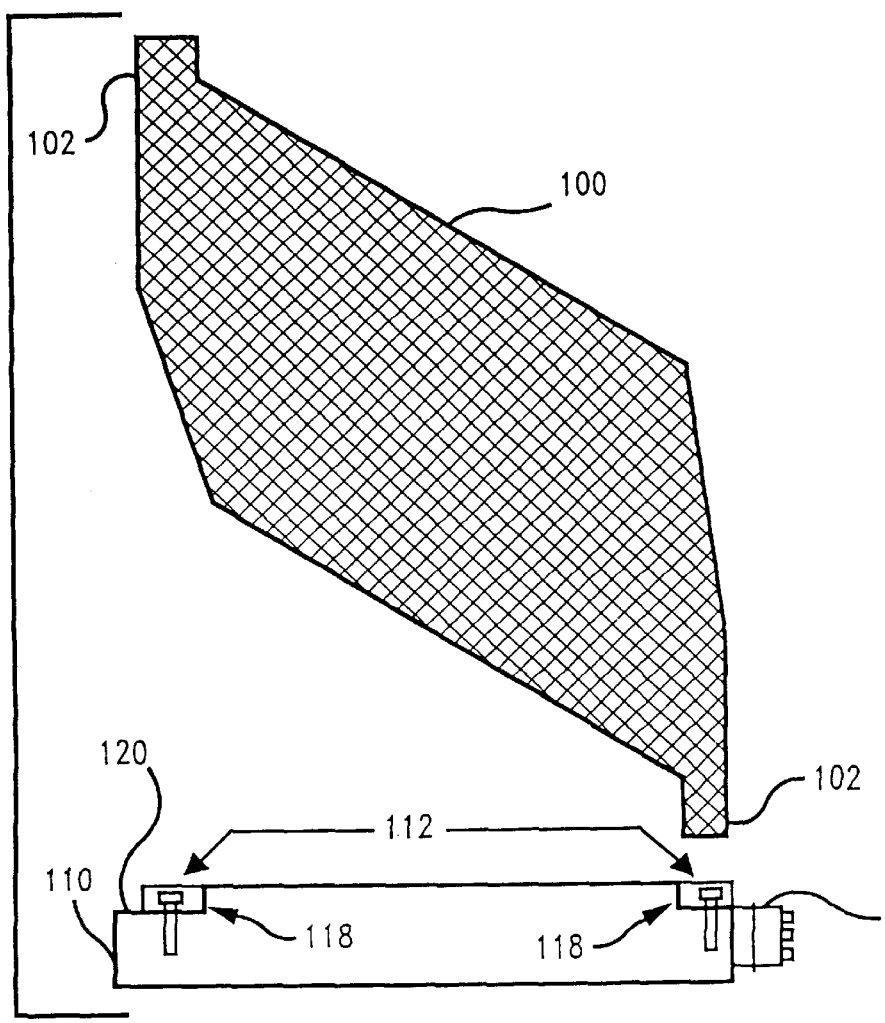
FIG. 1 is a drawing of a preferred embodiment cleaning pad and roller.

FIG. 1 is a drawing of the preferred cleaning pad 100 and roller 110. The pad 100 is a sheet of felt, preferably 0.035 inches ±0.015 inches thick. The pad 100 has a pair of tabs 102 at opposing ends for attachment to a roller. The pad is shaped such that when in place on the roller, the pad does not overlay itself and does not extend beyond the sides of the roller.

Figure 2:
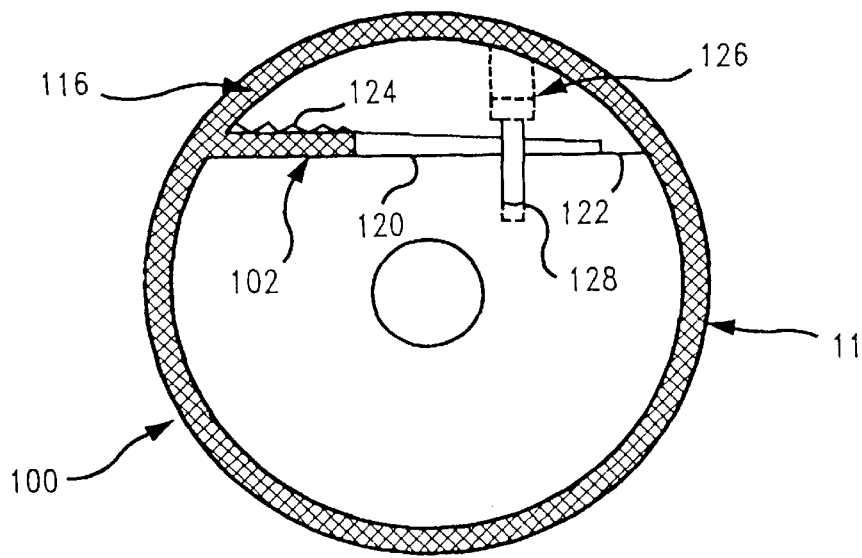
FIG. 2 is an end view of a preferred embodiment roller with a preferred embodiment cleaning pad in place.

FIG. 2 is an end view of the preferred embodiment roller 110 with the preferred embodiment pad 100 held firmly in place. The roller has clamping means 112 disposed at opposite ends, for securely holding the cleaning pad 100 in place on the roller 110 and further includes driving means 114 for rotatably driving the roller.

The clamping means 112 on the preferred embodiment roller 110 is a lever 116 mounted in a notch 118. The notch 118 forms a shelf 120 on which the lever 116 is mounted. The lever 116 clamps a pad tab 102 to the shelf 120, firmly holding the clamped tab 102 in place. The preferred lever 116 has a pivot 122 at one end and a serrated surface 124 for gripping the tab 102 at an opposite end. A clamping screw 126 locks the lever 116 firmly against the tab 102, which is thus clamped between the serrated surface 124 and the shelf 120. Preferably, the clamping screw 126 passes through the lever 116 between the pivot 122 and the serrated surface 124 and enters the roller 110 in a threaded hole 128 in the shelf 120. So, screwing the clamping screw 126 into the shelf 120 tightens the clamping means 112 grip on the clamped tab 102.

Figure 3A:
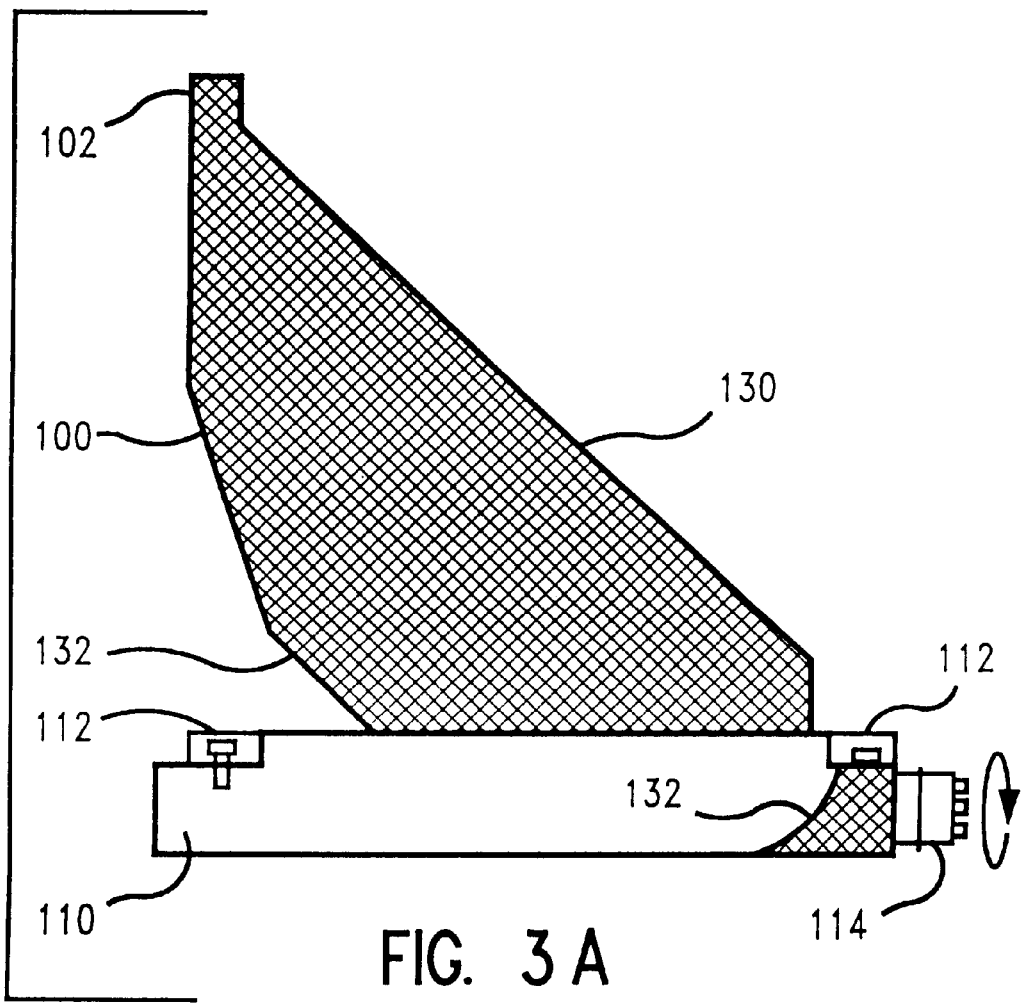
FIGS. 3A–B represent the preferred embodiment pad being attached to the preferred embodiment roller.
Figure 3B:
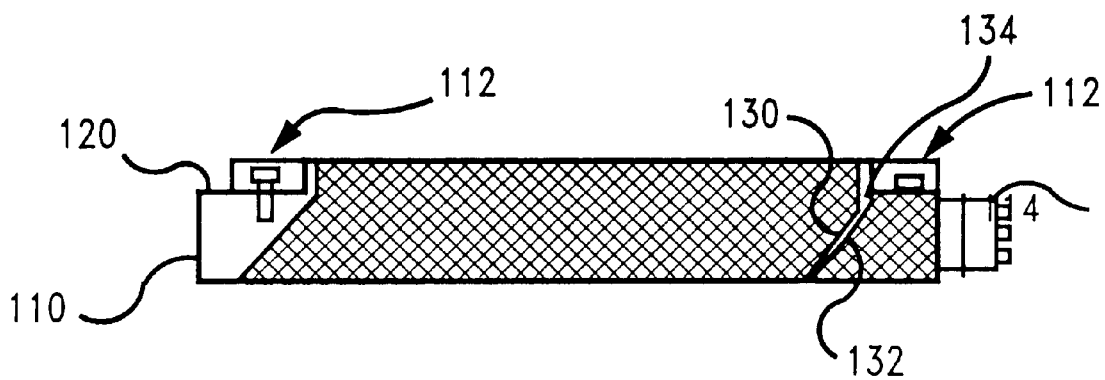

In FIG. 3A, the pad 100 is attached to the roller 110 by inserting one tab 102 into one of the clamping means 112; tightening the clamping screw 126 to clamp the inserted tab 102; wrapping the pad 100 in the intended direction of rotation in a helix-like fashion around the roller 110; and, in FIG. 3B, inserting and clamping the remaining tab 102 in the remaining clamping means 112. Once the pad 100 is in place, the pad edges 130, 132 do not overlap and are gapped from each other. When the roller rotates during cleaning, the gap 134 channels used cleaning solution, debris, etc. away and off of the article being cleaned.

Figures 4A, 4B:
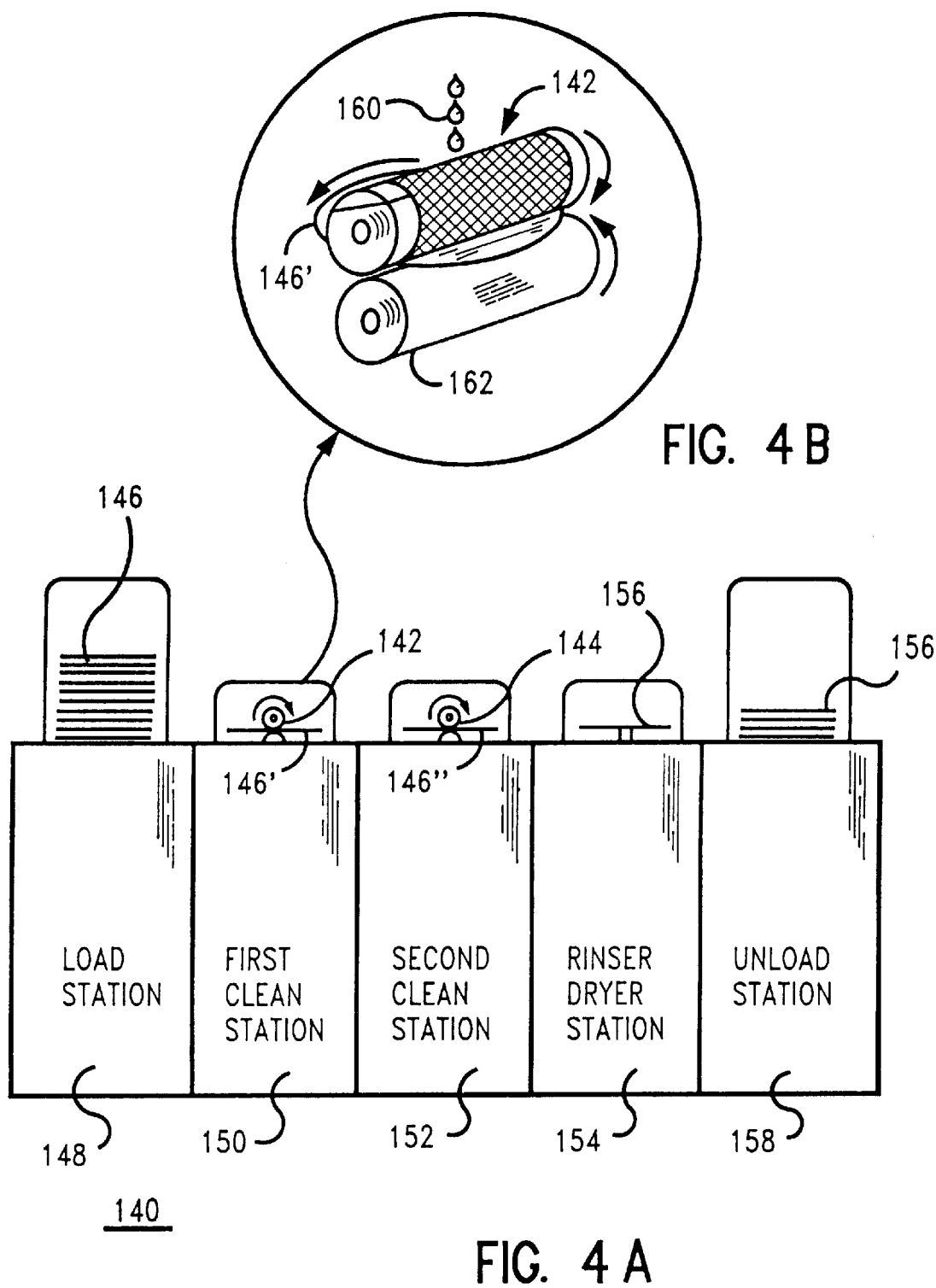
FIGS. 4A–B represent the preferred embodiment pad and roller assembly used in a wafer cleaning system.

FIG. 4A represents a wafer cleaning apparatus 140 including preferred embodiment cleaning pad and roller assemblies 142, 144. Uncleaned wafers 146 are loaded into loading station 148 which sequentially passes them, one at a time, to a first cleaning station 150. After being partially cleaned in the first cleaning station 150, the partially clean wafer 146' is passed to a second cleaning station 152. From the second cleaning station 152, the cleaned wafer 146" is passed to a rinser/dryer station 154 where the wafer is rinsed and, then, dried. Finally, the clean, dry wafer 156 is passed to unloading station 158 where it is stored for removal.

As is apparent from FIG. 4B, which is an expanded view of the first cleaning station 146 and is typical for both cleaning stations 150 and 152, cleaning solution 160 drops onto the cleaning pad and roller assembly 142. The wafer 146' being cleaned passes between a support roller 162 and the cleaning pad/roller assembly 142. The cleaning pad/roller assembly 142 acts to provide fresh cleaning solution to the wafer 146', while simultaneously removing spent, contaminated cleaning solution and debris.

The cleaning pad and roller assembly for cleaning semiconductor wafers comprises, a roller means 110, and a pad 100, said pad 100, being clamped and wrapped around said roller means 110, in helix-like fashion such that at least a portion of the edge 130, 132, of said pad 100, forms a non-contiguous surface to form said cleaning pad and roller assembly.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

I claim:

1. A cleaning pad and roller assembly for cleaning semiconductor wafers comprising:

a roller means; and a pad, said pad being clamped and wrapped around said roller means in helix-like fashion such that at least a portion of the edge of said pad forms a non-contiguous surface to form said cleaning pad and roller assembly.

2. The assembly of claim 1, wherein said roller means comprises:

clamping means for clamping said pad; and, driving means for rotatably driving said roller means.

3. The assembly of claim 2, wherein said clamping means comprises:

a notch in said roller means, said notch forming a shelf;

a clamping lever mounted in said notch; and locking means for locking said clamping lever in place against said shelf, whereby said pad is clamped by said clamping lever to said shelf.

4. The assembly of claim 3, wherein said clamping lever includes:

a pivot at one end of said clamping lever; and a serrated surface at an opposite end of said clamping lever.

5. The assembly of claim 4, wherein said locking means comprises a screw passing through said lever and entering said roller, and whereby said screw holds said clamping means in place.

6. The assembly of claim 1, wherein said roller means is polyvinylchloride.

7. The assembly of claim 1, wherein said pad is approximately 0.035 inches thick.

8. The assembly of claim 1, wherein thickness of said pad is between about 0.020 inches and about 0.050 inches.

9. The assembly of claim 1, wherein said pad is a felt sheet.

10. The assembly of claim 1, wherein said pad is a felt sheet with a tab at an opposing end.

11. The assembly of claim 1, wherein said inner edge of said pad creates a gap.

12. The assembly of claim 1, wherein said inner edge of said pad creates a gap, and upon rotation of said roller said gap channels cleaning solution and/or debris.

13. The assembly of claim 1, wherein said pad has a cleaning solution.

14. The assembly of claim 1, wherein said wafer passes between a support roller and said cleaning pad and roller assembly to be cleaned.

15. A cleaning pad and roller assembly for cleaning semiconductor wafers comprising:

a felt pad with a tab located at opposite ends of said felt pad, wherein at least a portion of the edge of said pad forms a non-contiguous surface;

a polyvinylchloride roller with a driving means at one end; and a clamp at each end of said roller, each said clamp being a clamping lever mounted on a shelf and locked in place by a clamping screw, each said clamping lever having a pivot at one end, and a serrated surface at an opposite end, said clamping lever being held in place by a clamping screw, and wherein said clamping screw passes through said clamping lever into said shelf to form said cleaning pad and roller assembly.

16. The assembly of claim 15, wherein said felt pad is approximately 0.035 inches thick.

17. The assembly of claim 15, wherein thickness of said felt pad is between about 0.020 inches and about 0.050 inches.

18. The assembly of claim 15, wherein said inner edge of said felt pad creates a gap.

19. The assembly of claim 15, wherein said inner edge of said felt pad creates a gap, and upon rotation of said roller said gap channels cleaning solution and/or debris.

20. The assembly of claim 15, wherein said felt pad has a cleaning solution.

21. The assembly of claim 15, wherein said wafer passes between a support roller and said cleaning pad and roller assembly to be cleaned.

* * * * *